(12) United States Patent
Weekamp et al.

(10) Patent No.: US 7,052,933 B2
(45) Date of Patent: May 30, 2006

(54) METHOD OF MANUFACTURING AN ELECTRONIC DEVICE, AND ELECTRONIC DEVICE

(75) Inventors: Johannus Wilhelmus Weekamp, Eindhoven (NL); Nicolaas Johannes Anthonius Van Veen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 10/510,874

(22) PCT Filed: Apr. 8, 2003

(86) PCT No.: PCT/IB03/01420

§ 371 (c)(1),
(2), (4) Date: Oct. 8, 2004

(87) PCT Pub. No.: WO03/085730

PCT Pub. Date: Oct. 16, 2003

(65) Prior Publication Data

US 2005/0148112 A1   Jul. 7, 2005

(30) Foreign Application Priority Data

Apr. 11, 2002  (EP) .................................. 02076425

(51) Int. Cl.
*H01L 21/44* (2006.01)
*H01L 21/48* (2006.01)
*H01L 21/50* (2006.01)

(52) U.S. Cl. ............... 438/106; 438/108; 257/E21.001; 257/E21.499

(58) Field of Classification Search ................ 438/106, 438/108, 126; 257/684, 687, 690, E23.001, 257/E21.499, E33.056
See application file for complete search history.

(56) References Cited

U.S. PATENT DOCUMENTS 5,814,894 A * 9/1998 Igarashi et al. ............. 257/787
6,963,126 B1 * 11/2005 Sakamoto et al. .......... 257/687

FOREIGN PATENT DOCUMENTS

EP   1 143 509   10/2001
EP   1 187 205    3/2003

* cited by examiner

*Primary Examiner*—Matthew Smith
*Assistant Examiner*—Fernando L. Toledo
(74) *Attorney, Agent, or Firm*—Peter Zawilski

(57) ABSTRACT

The invention relates to a method of manufacturing a semiconductor device (10), whereby an electric element (11) is attached on or above a carrier plate (4) which comprises a first layer (5) of a first material and a second layer (2) of a second material which differs from the first, which is electrically conducting, which has a smaller thickness than the first layer (5), and in which a cavity (6) is formed that extends at least to the first layer (5). The element (11) is electrically connected to parts (2) of the carrier plate (4) at first connection regions (1), and an encapsulation is deposited around the element (11) and in the cavity (6). Then so much of the first layer (5) of the carrier plate (4) is removed that the cavity (6) is reached, whereby second connection conductors (2) are formed from the remaining portion of the carrier plate (4).

Figure 1:
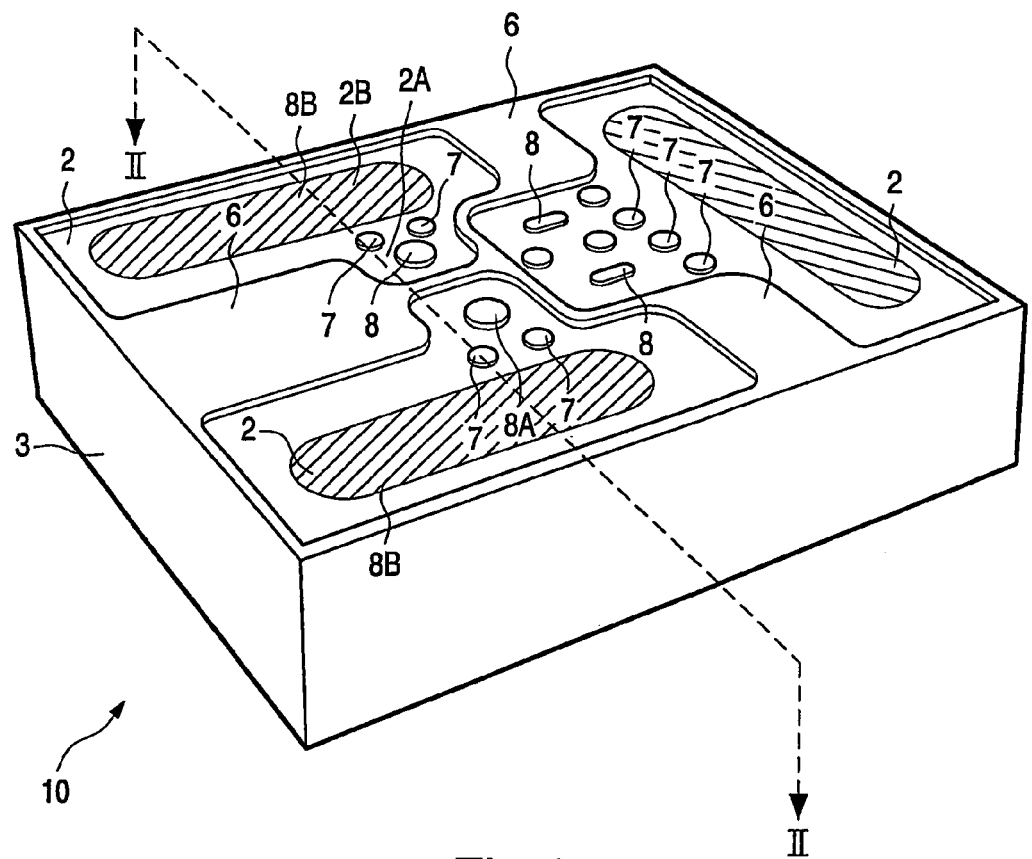

According to the invention, at least one further cavity (7) is formed in a portion of the carrier plate (4) surrounded by the cavity (6) before the encapsulation (3) is deposited, which further cavity (7) becomes at least substantially filled with a portion of the encapsulation (3) during the deposition thereof and, within the second connection regions (2), separates a portion (2A) thereof from the remaining portion (2B) thereof, the smallest dimension of the portion (2A) being chosen to be smaller than the smallest dimension of the remaining portion (2B) of each second connection region (2). The portion (2A) may thus be readily provided with solder (8A) having a smaller thickness than the solder (8B) in the remaining portion of the second connection region (2). This is an advantage, for example in the case of surface mounting of the device (10). Preferably, the first connection regions (1) are connected to the portion (2A) of the connection region (2).

11 Claims, 3 Drawing Sheets

METHOD OF MANUFACTURING AN ELECTRONIC DEVICE, AND ELECTRONIC DEVICE

The invention relates to a method of manufacturing an electronic device which comprises an electric element provided with first connection regions and with an electrically insulating envelope, which method comprises the steps of providing a recess in a first surface of a carrier plate, said plate comprising in that order a first layer of a first material and a second layer of a second, electrically conducting material different from the first material, which recess extends from the first surface through the second layer at least to the first layer; providing the electric element on or above the surface of the carrier plate; electrically connecting the first connection regions to portions of the second layer lying within the recess; surrounding the electric element by means of the insulating envelope which fills the recess in the carrier plate at least substantially; and removing the carrier plate from a second surface of the carrier plate, which second surface faces away from the first surface, to at least an extent such that the recess filled by a portion of the envelope is reached, whereby second connection regions are formed by the portions of the second layer lying within the recess.

The invention also relates to a semiconductor device comprising an electric element provided with first connection regions, further comprising second connection regions with a first side and with a second side facing away therefrom, which second connection regions are provided at the first side with an electrical connection to the first connection regions and can be provided at the second side with electrical connection pieces for placement on a substrate, which electric element is surrounded by an electrically insulating envelope which extends at least to the second connection regions.

Such a method is particularly suitable for the inexpensive manufacture of semiconductor devices among other items. The electric element therein is an electric element, such as a (semi-)discrete transistor or diode, an integrated circuit, a memory circuit, etc. The devices manufactured by such a method may also be particularly compact, which renders possible the ever advancing miniaturization required in many applications.

Such a method and such a semiconductor device are known from European patent EP 1 160 858 A2. It is described therein how a semiconductor IC (=Integrated Circuit) can be enveloped in a compact manner. The IC is fastened on or above a carrier plate. The first connection regions of the IC are connected to parts of the carrier plate either directly or via an electrically conducting wire. The carrier plate comprises two metal layers in succession, of which the upper layer adjoining the IC has a smaller thickness than the lower layer. The carrier plate is provided with a recess which extends from the surface of the second layer into the first layer and which surrounds portions of the carrier plate from which the second connection regions of the enveloped IC will be formed. After the IC has been provided on or above the carrier plate, an electrically insulating (and passivating) envelope is provided around the IC and against the carrier plate. The recess is largely filled up with part of the envelope thereby. Then as large as possible a portion of the carrier plate is removed, in particular a major portion of the first layer thereof, such that the recess filled with a portion of the envelope is reached. The second connection regions of the enveloped IC are formed thereby from (remaining) portions of the carrier plate. The IC is then ready, for example, for final surface mounting or for fastening to a lead frame.

A disadvantage of the known method is that the solder provided as solder bumps on the second connection regions for final mounting will flow out over the entire connection region with a comparatively small and substantially homogeneous thickness after the necessary heating, and will thus remain present also after solidification. This may be avoided through the provision of a solder-repelling layer on the second connection regions, which layer is provided with openings by means of photolithography, in which openings the solder bumps are provided. This, however, makes the method more complicated. This is because said photolithography step has to take place during the assembling process, i.e. after the enveloping step. Such assembling processes, however, are often carried out in factories in which lithographic equipment is not present. In addition, a lithographic step requires an accuracy and time duration which are not available during assembling. An alternative reduction in size of the second connection regions does not provide a solution either, because this will cause the electrical and thermal quality of the connection of the IC to the outer world to deteriorate. This is also not desirable.

It is accordingly a first object of the invention to provide a method which does not have the above disadvantage, or at least to a lesser degree, and which is yet simple and accordingly inexpensive.

According to the invention, a method of the kind mentioned in the opening paragraph is for this purpose characterized in that the recess extends into the first layer, such that underetching takes place in the first layer with respect to the second layer under formation of a cavity, which cavity is filled up by the insulating envelope.

Etching down into the first layer creates a cavity below the second layer. This cavity is filled up by the insulating envelope. The edges of the second connection regions are provided thereby with a protective layer consisting of the insulating envelope. When the carrier plate is removed from the second surface, this protective layer will come to the surface. The second connection regions lie recessed with respect to said surface.

The method according to the invention has among its advantages that no lithographic step is necessary any more after enveloping; the second connection regions are in fact patterned into contact surfaces by means of the envelope. The properties of the electrically insulating envelope, which often comprises a synthetic resin such as an epoxy resin or a thermoplastic material, are such that solder is repelled thereby. The solder that is subsequently applied to the second connection regions thus remains restricted to the contact surfaces.

It is a further advantage of the method according to the invention that the second layer may be kept thin, in particular in comparison with the first layer. This has the result that second connection regions can be positioned at a smaller mutual distance than was possible in the prior art.

Finally, a major advantage of a method according to the invention is that it is comparatively simple and does not require an additional step.

In a favorable embodiment of the method, before the envelope is provided, at least one further recess is provided in a portion of the carrier plate surrounded by the recess, which further recess is substantially filled with a portion of the envelope during the provision thereof. Said further recess is positioned within the respective second connection region such that a portion thereof is delimited from the remaining portion of the second connection region, the smallest dimension of said portion being chosen to be smaller than the smallest dimension of the remaining portion of the second connection region. When the carrier plate is removed, so much of the carrier plate is removed that also the further recess is reached. Each second connection region formed is thus locally interrupted by a portion of the envelope present there. The properties of the electrically insulating envelope, which often comprises a synthetic resin such as an epoxy resin or a thermoplastic material, are such that solder is repelled thereby. It is true that the solder bump when provided at one side of the interruption of the second connection region will flow out during melting over the entire remaining portion of the second connection region, but after solidification it will remain present with a greater thickness in that portion of the connection region whose smallest dimension is greatest. Such a local elevation of the solder is particularly favorable, for example, for final surface mounting of the semiconductor device. In addition, the electrical and thermal properties of the connection of the electric element to the outer world remain excellent because the surface of the total second connection region is hardly made smaller by the local interruption thereof, while also the electrical and thermal quality of the interconnection between the (two) parts of the second connection region thus formed remains excellent. This is very important, in particular in the case of comparatively compact semiconductor devices, even if the absolute power dissipation thereof is not great, because the power density increases in such devices.

In a preferred embodiment of a method according to the invention, therefore, a solder particle is provided on at least a portion of each second connection region after so much of the carrier plate has been removed that the recess and further recess have been reached and the second connection regions have been formed. Preferably, the solder particle is melted after its application such that each second connection region is wetted in its entirety, and such that the height of the solder in said portion of each second connection region is smaller than it is in the remaining portion of each second connection region after solidification of the solder owing to cooling-down.

In a major embodiment, the first connection regions are connected to said portions of the second connection regions. As a result, the connection between the first and the second connection region is not broken again or mechanically loaded during final mounting of the finished device by means of the thicker solder of the remaining portion of each second connection region. Preferably, furthermore, the recess and the further recess are simultaneously formed in one and the same process step. The method according to the invention is not more complicated or more expensive than the known method in that case. The use of an adapted mask suffices for achieving the desired result.

Preferably, the further recess is formed as one or several recesses in the carrier plate which are positioned within the respective second connection region to be formed such that they, together with a portion of the inner edge of the recess, delimit a portion of each second connection region whose smallest dimension is smaller than the smallest dimension of the remaining portion thereof. The ratio of the smallest dimension of the portion to that of the remaining portion of the second connection region is preferably chosen to be smaller than ½, and more preferably between ⅓ and ⅙. Very favorable results were obtained when aluminum was chosen for the material of the first layer of the carrier plate and copper for the material of the second layer of the carrier plate. These materials, and in particular copper, have good electrical and thermal properties and in addition can be very well, even selectively etched with respect to one another, for example in a wet-chemical etchant. The removal of the major portion of the carrier plate may also very well be effected by means of CMP (=Chemical Mechanical Polishing).

Good results were obtained when the thickness of the first layer of the carrier plate was chosen to lie between 10 and 300 μm, and preferably at approximately 30 μm, and the thickness of the second layer was chosen to lie between 2 and 20 μm, preferably at 10 μm. It is advantageous to remove the first layer of the carrier plate in its entirety after the envelope has been provided. A very good etchant for aluminum—besides a possible use of CMP—is formed by hot sodium lye. The method according to the invention is particularly suitable for the manufacture of semiconductor devices with discrete or semi-discrete electric elements such as used, for example, in mobile telephones. The invention also relates to semiconductor devices obtained by a method according to the invention.

It is a second object of the invention to provide a semiconductor device of the kind mentioned in the second paragraph which can be manufactured in an inexpensive manner and in which the second connection regions are effective protected.

This second object is achieved in that the envelope extends to the second side of the second connection regions such that the second connection regions are accessible in a recess of the envelope for being placed on the substrate. The second connection regions in the semiconductor device according to the invention lie in a recess of the envelope, i.e. recessed with respect to the surface of the semiconductor device. The semiconductor device thus complies with the requirements for placement on a substrate, while no additional layers are necessary for this.

The electrical connection in the semiconductor device is preferably formed by bumps, but it may alternatively be realized with solder, bonding wires, or anisotropically conducting glue. It is furthermore possible to realize the connection in a contactless manner, for example by capacitive coupling, in particular for electric elements in which the number of incoming and outgoing signals and the power dissipation are comparatively limited, such as those used for identification purposes.

The connection pieces for placement on a substrate are preferably solder bumps. Alternatively, anisotropically conducting glues or other connection pieces may be used.

In a favorable embodiment, the device is provided with second connection regions of varying size on which the solder bumps, when applied as electrical connection pieces, will have a height which is dependent on the size of the respective second connection region. The use of solder bumps of varying heights is found to be a very desirable characteristic of an envelope in practice. This may be realized in a simple manner in the device according to the invention thanks to the repelling action of the envelope with respect to solder.

Figure 2:
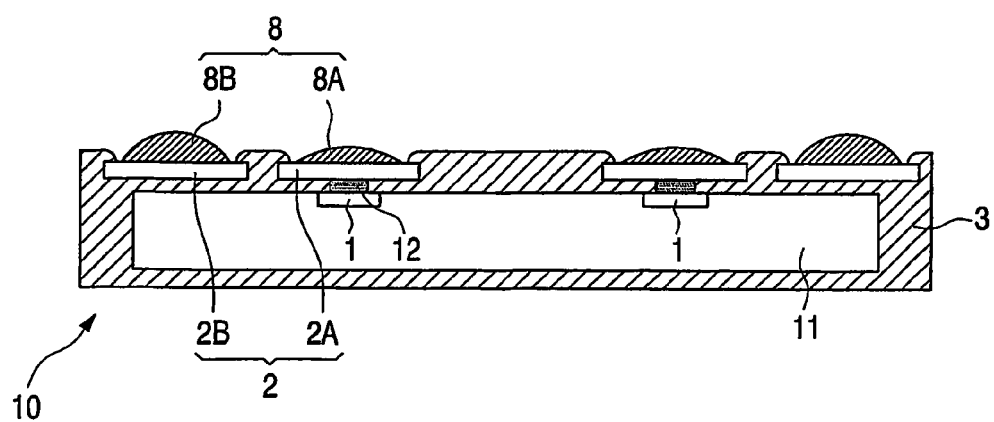

The invention will now be explained in more detail with reference to an embodiment and the drawing, in which FIG. 1 diagrammatically and in perspective view shows a semiconductor device manufactured by a method according to the invention, FIG. 2 shows the device of FIG. 1 in a diagrammatic cross-sectional view taken on the line II—II in the thickness direction, and FIGS. 3 to 9 show the device of FIG. 1 in consecutive stages of manufacture by an embodiment of a method according to the invention in a diagrammatic cross-sectional view taken on the line 11—11 in the thickness direction.

The Figures are not true to scale, and some dimensions have been particularly exaggerated for greater clarity. Corresponding regions or components have been given the same reference numerals as much as possible.

FIG. 1 is a diagrammatic perspective view of a semiconductor device manufactured by a method according to the invention. FIG. 2 also shows the device of FIG. 1, in a diagrammatic cross-sectional view taken on the line II—II in the thickness direction. FIGS. 2 to 5 are diagrammatic cross-sectional views taken on the line II—II in the thickness direction in FIG. 1 of the device of FIG. 1 in consecutive stages of its manufacture by means of an embodiment of a method according to the invention. The device 10 comprises an electric element 11 (see FIG. 2) which is provided with a plurality, three in this case, of first connection regions 1, two of which are depicted in FIG. 2, and which is surrounded by an envelope 3, made of epoxy material in this case. A second connection region 2 for each first connection region 1 is present on the envelope 3 and is connected thereto by means of solder 12. The electric element 11 in this example comprises a bipolar transistor 11 and is accordingly provided with three second connection regions 2, as can be seen at the upper side. Said regions are provided with solder 8.

The second connection regions 2 are surrounded by portions 6 of the envelope 3, and portions 7 of the envelope 3 lie within the second connection regions 2. The solder 8 extends over each entire second connection region 2, but it has a greater thickness locally (see FIG. 2). Since portions 2A of the second connection regions 2 are delimited from the remaining portion 2B of the second connection regions 2 by portions 7 of the envelope 3 and by a portion of the inner edge of the portions 6 of the envelope 3, a solder bump 8 placed in the second connection region 2 has indeed wetted the entire second connection region 2 after melting but, after solidification of the solder 8, the thickness of the portion 8A of the solder 8 lying on the portion 2A will be smaller than the thickness of the portion 8B of the solder 8 lying on the remaining portion 2B. This is also because the smallest dimension of the portion 2A is smaller than the smallest dimension of the remaining portion of the second connection region. This difference in thickness of the solder 8 is favorable for surface mounting of the device 10.

FIGS. 3 to 9 are diagrammatic cross-sectional views taken on the line II—II in the thickness direction in FIG. 1 showing the device of FIG. 1 in consecutive stages of manufacture by an embodiment of a method according to the invention.

Figure 3:
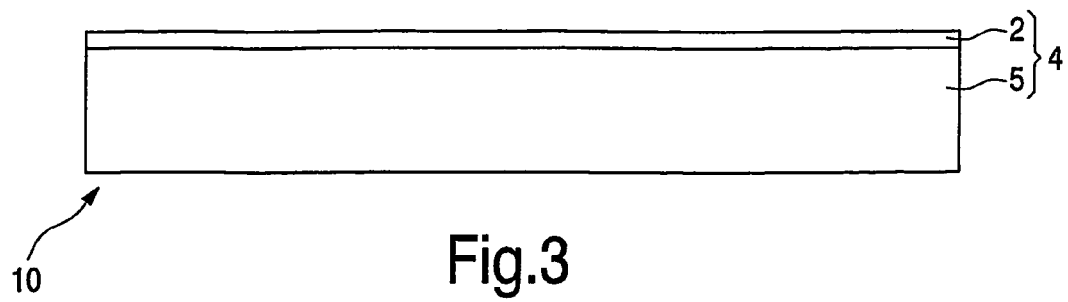
Figure 4:
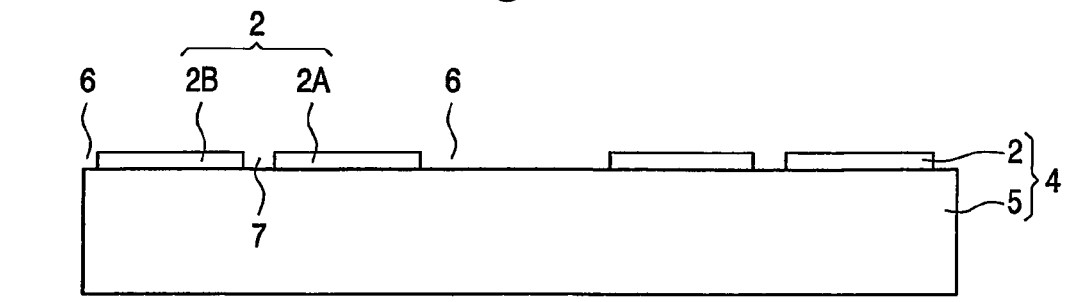
Figure 5:
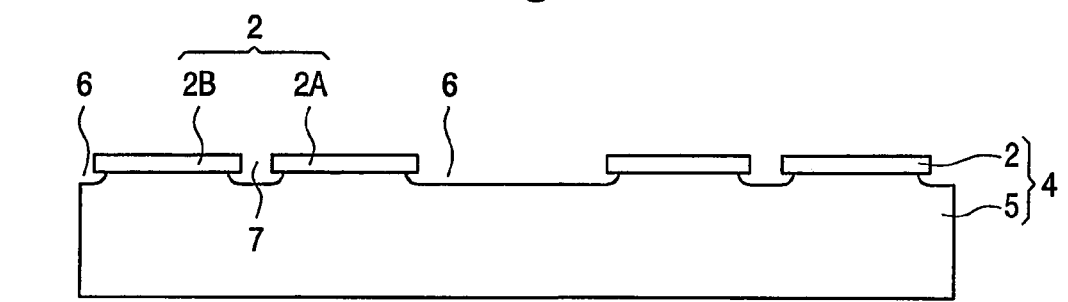

The method starts, see FIG. 3, with a carrier plate 4 which comprises a first layer, of aluminum in this case and 30 µm thick. A second layer 2 of an electrically conducting material, copper in this case, and with a thickness smaller than that of the first layer 5, 10 µm in this case, is present thereon. In this assembly, see FIG. 4, the beginning of a recess 6 and of a further recess 7, i.e. two further, round recesses 7, are formed by means of photolithography and etching. The etchant used may be, for example, ferrichloride which etches copper more or less selectively with respect to aluminum. Subsequently, see FIG. 5, the formation of the recess 6 and of the further recess 7 is continued in that the first layer 5 of the carrier plate 4 is etched. Aluminum may be selectively etched with respect to copper, for example, by means of sodium lye. In this manner the aluminum of the first layer 5 is underetched with respect to the portions 2A, 2B of the copper layer 2.

Figure 6:
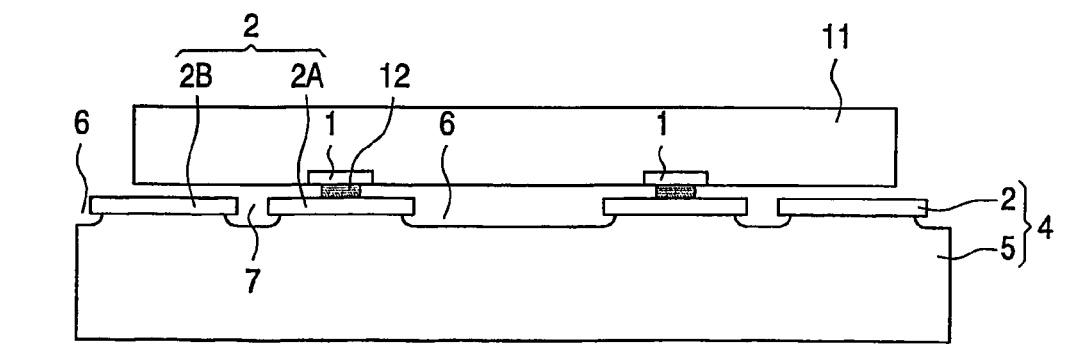

Subsequently, see FIG. 6, an electric element 11, a bipolar transistor 11 in this case, is fastened on or above, in this case on the carrier plate 4. This is done here by means of solder 12, with which the electric element 11 is fastened by its connection regions 11 to the portions 2A, 2B of the carrier plate 4. The electric element 11 may be fastened to the carrier plate 4 in an alternative manner, for example by means of an electrically insulating glue. The connection regions 1 of the element 11 are then preferably turned so as to face away from the carrier plate 4 and are electrically connected to the portions 2A, 2B of the carrier plate 4 by means of conductive wires.

Figure 7:
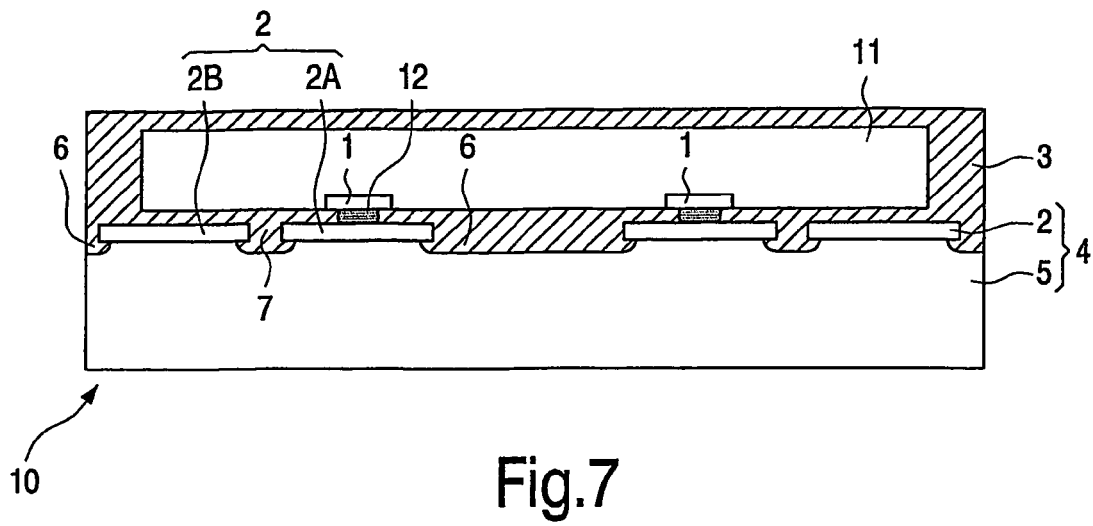
Figure 8:
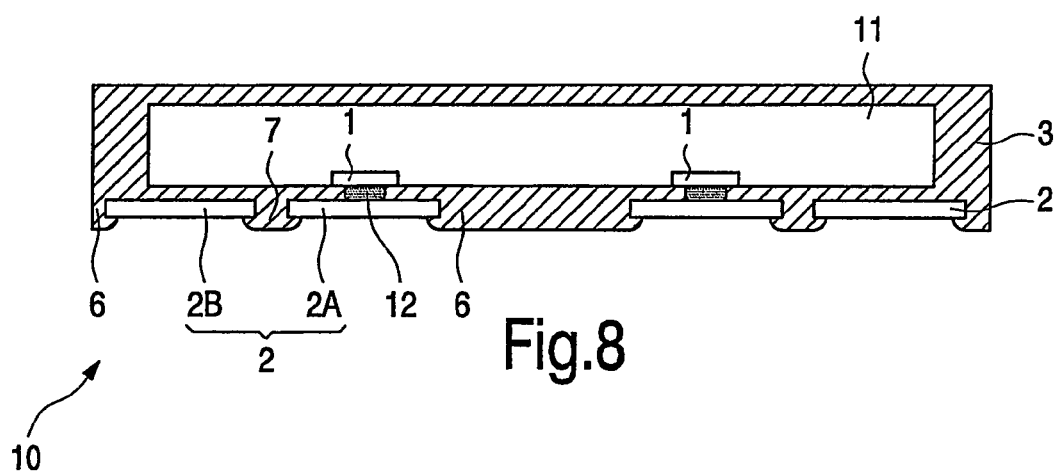

After this, see FIG. 7, the device 10 is placed in a mold (not shown) and an envelope 3 comprising an epoxy resin material in this case, is provided around the element 11 and pressed against the carrier plate 4 by means of injection molding. The recess 6 and the further recess 7 are thus filled with portions 6, 7 of the envelope 3. Subsequently, see FIG. 8, a major portion of the carrier plate 4 is removed, by means of CMP (=Chemical Mechanical Polishing) in this case. This continues until the recess 6 and further recess 7 filled with portions of the envelope 3 have been reached. In the present example, the final remnants of the first layer 5 still present between the portions 6 and 7 of the envelope 3 are then removed in an etching process, for example by means of the selective etchant for aluminum mentioned above.

Thus, according to the invention, a smaller portion 2A—at least as regards the smallest dimension—is delimited within each second connection region 2 from the larger remaining portion 2B of each second connection region. The delimitation of the portion 2A is formed on the one hand by the inner edge of the portion 6 of the envelope 3 surrounding the second connection region 2, and on the other hand by the portions 7, two portions here, of the envelope 3 formed within the second connection region 2.

Figure 9:
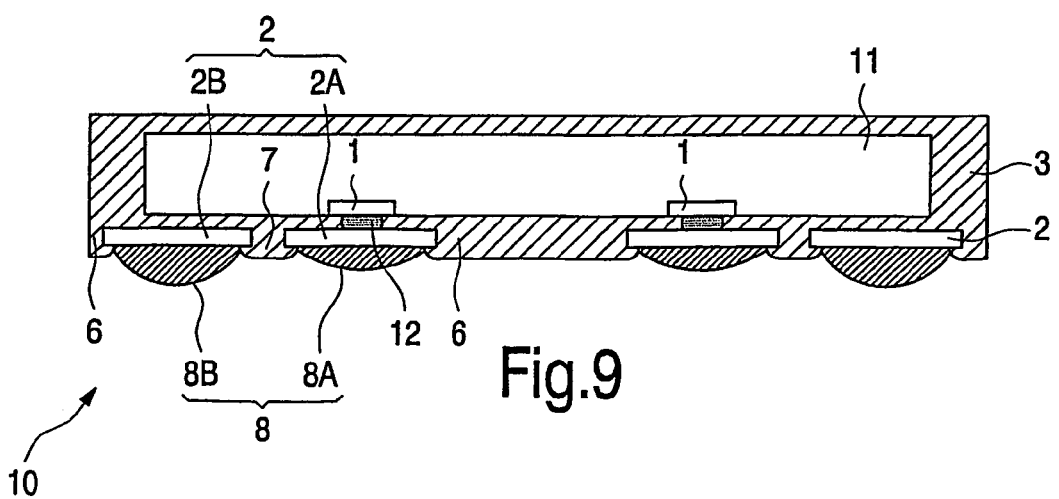

After the solder bump 8, see FIG. 9, has been placed on the portion 2B of the second connection region 2, for example, and has been melted, the solder 8 will flow out over the entire second connection region 2 before it solidifies again owing to cooling down, but the thickness of the solder 8A in the portion 2A of the second connection region 2 will be smaller than in the portion 2B thereof. The electrical and thermal qualities of the portions 2A, 2B are substantially the same here as in the case in which the portions 7 of the envelope 3 are not present within each second connection region 2. This is true in particular thanks to the fact that the portions 6 and 7 of the envelope 3 extend partly above the second connection region 2, so that the surface area thereof is not or at least substantially not reduced. The result is a particularly compact semiconductor device 10 which is highly suitable for surface mounting and which also has very favorable thermal and electrical properties. It is of particular advantage here that the first connection regions 1 of the element 1 in this example are connected to the portion 2A of the second connection region 2, where the solder thickness is smallest. It is noted that FIG. 9 shows the same assembly as FIG. 2, but FIG. 9 has been rotated through 180° in the plane of drawing with respect to FIG. 2. This is connected with the manufacture of the device 10 described with reference to FIGS. 3 to 9, which makes such a representation logical.

The following should be noted with respect to the dimensions of the device 10 whose manufacture was described above. The dimensions of the electric element 11 are 350× 350 µm$^2$. Its thickness is approximately 200 µm. The entire device 10 measures 1000×800×230 µm$^3$. The fact that the entire device 10 is larger than the element 11 has the advantage that the device can be positioned more easily by means of a placement machine, for example during final mounting. The thickness of the solder 8A is, for example, 30 µm, and that of the solder 8B 150 µm. The smallest dimensions of the portion 2A and of the remaining portion 2B of each second connection region 2 are approximately 30 and 180 µm, respectively. These are the dimensions measured along the line II—II in FIG. 1 in the present example. The portion 2A, furthermore, is approximately square, and the greatest dimension of the remaining portion 2B of each second connection region is approximately 600 µm.

The invention is not limited to a method as described for the embodiment, since many variations and modifications are possible to those skilled in the art within the scope of the invention. Thus devices may be manufactured with different geometries and/or different dimensions. It is also possible to use alternative materials, especially for the carrier plate.

It is further noted that a large number of devices can be manufactured simultaneously by the method according to the invention, although the manufacture of a single device only is described and depicted for the embodiment. Individual semiconductor devices may then be obtained by mechanical separation techniques such as sawing, cutting, or breaking. In an attractive modification, another recess is formed between two adjoining devices in the carrier plate. When the envelope is provided over the element in the form of a drop of liquid, this liquid will wet the carrier plate and the element up to the edge of the other recess. The liquid may then be cured. When the carrier plate is removed, the individual devices will then automatically become separated.

Besides semiconductor devices with a discrete element, as in the example, smaller, semi-discrete ICs, for example comprising 1 to 100 active and/or passive elements, may alternatively be manufactured. An application to larger, more complicated ICs is also advantageously possible. Another advantageous possibility is to use a filter or one or several passive elements as the electric element.

It is finally noted that the second connection region may be given a geometry other than that shown in the examples. Thus both the portion and the remaining portion of said region may have approximately a circular geometry, the circles being interconnected by one or several narrower portions. It will be obvious that in this case the smallest dimension both of the portion and of the remaining portion of the second connection region will be equal to the diameter of the respective portion and remaining portion of the second connection region. The further recesses need not be round, as in the example, but may have some other geometry.

The invention claimed is:

1. A method of manufacturing an electronic device which comprises an electronic element provided with first connection regions and with an electrically insulating envelope, which method comprises of:

providing a recess in a first surface of a carrier plate, said plate comprising in that order a first layer of aluminum and a second layer of copper which recess extends from the first surface through the second layer at least to the first layer; wherein the recess extends into the first layer, such that underetching takes place in the first layer with respect to the second layer under formation of a cavity, said cavity is filled up by the insulating envelope;

providing the electric element on or above the surface of the carrier plate;

electrically connecting the first connection regions to portions of the second layer lying within the recess;

surrounding the electric element by means of the insulating envelope which fills up the recess in the carrier plate at least substantially; and removing the first layer of the carrier plate from the second layer of the carrier plate, which second layer faces away from the first surface, to at least an extent such that the recess filled by a portion of the envelope is reached, whereby second connection regions are formed by the portions of the second layer lying within the recess.

2. A method as claimed in claim 1, characterized in that, before the envelope is provided, at least one further recess is provided in a portion of the carrier plate surrounded by the recess, which further recess is largely filled with a portion of the envelope during the application thereof, and which further recess is positioned within each second connection region such that a portion thereof is delimited from the remaining portion of the second connection region, the smallest dimension of said portion being chosen to be smaller than the smallest dimension of the remaining portion of the second connection region, and so much of the carrier plate is removed that also said further recess is reached.

3. A method as claimed in claim 1, characterized in that a solder particle is provided on at least a portion of each second connection region after so much of the carrier plate has been removed that the recess and the further recess have been reached and the second connection regions have been formed.

4. A method as claimed in claim 3, characterized in that the solder particle is melted after its application such that each second connection region is wetted in its entirety, and such that the height of the solder in said portion of each second connection region is smaller than it is of the solder in the remaining portion of each second connection region after solidification of the solder owing to its cooling down.

5. A method as claimed in claim 2, characterized in that the first connection regions are connected to said portions of the second connection regions.

6. A method as claimed in claim 2, characterized in that the recess and the further recess are formed in one and the same process step.

7. A method as claimed in claim 2, characterized in that the further recess is made in the form of one or several recesses in the carrier plate which are positioned within each second connection region under formation such that they together with part of the inner edge of the recess surround a portion of each second connection region, of which portion the smallest dimension is smaller than the smallest dimension of the remaining portion of each second connection region.

8. A method as claimed in claim 2, characterized in that the ratio of the smallest dimension of the portion to that of the remaining portion of the second connection region is chosen to be smaller than about ½.

9. A semiconductor device comprising an electric element provided with first connection regions, further comprising second connection regions comprised of copper with a first side and with a second side facing away therefrom, which second connection regions are each provided at the first side with an electrical connection to the first connection regions and can be provided at the second side with electrical connection pieces for placement on a substrate, which electrical element is surrounded by an electrically insulating envelope which extends at least to the second connection region, characterized in that the envelope extends to the second side of each second connection region such that the second connection region is accessible in a recess of the envelope for being placed on the substrate.

10. A semiconductor device as claimed in claim 9, and provided with second connection regions of varying size, whereon, when solder bumps are used as the electrical connection pieces, said bumps will have a height which is dependent on the size of the respective second connection region.

11. A method as claimed in claim 2, characterized in that the ratio of the smallest dimension of the portion to that of the remaining portion of the second connection region is chosen to be from about ⅓ to about ⅙.

* * * * *